US006467824B2

United States Patent
Bolotin et al.

(10) Patent No.: US 6,467,824 B2
(45) Date of Patent: Oct. 22, 2002

(54) FLOATING SEAL PICK AND PLACE SYSTEM AND UNIT THEREFOR

(75) Inventors: Lev M. Bolotin, Kirkland, WA (US); Bryan D. Powell, Maple Valley, WA (US); Rossen Atanassov Rachkov, Monroe, WA (US)

(73) Assignee: Data I/O Corporation, Redmond, WA (US)

( * ) Notice: Subject to any disclaimer, the term of this patent is extended or adjusted under 35 U.S.C. 154(b) by 0 days.

(21) Appl. No.: 09/883,661

(22) Filed: Jun. 16, 2001

(65) Prior Publication Data

US 2002/0135191 A1 Sep. 26, 2002

Related U.S. Application Data

(60) Provisional application No. 60/275,552, filed on Mar. 13, 2001.

(51) Int. Cl.[7] .............................. B25J 15/06; B66C 1/02
(52) U.S. Cl. ......................... 294/64.1; 294/65; 29/743; 414/737
(58) Field of Search ..................... 294/2, 64.1, 64.2, 294/64.3, 65; 29/740, 741, 743, DIG. 44; 271/90, 91; 414/627, 737, 752.1; 901/40

(56) References Cited

U.S. PATENT DOCUMENTS

| | | | | | |
|---|---|---|---|---|---|
| 2,774,179 A | * | 12/1956 | Zalkino | ...................... | 294/65 |
| 3,056,317 A | * | 10/1962 | Huber | ................... | 29/DIG. 44 |
| 3,219,380 A | * | 11/1965 | Carlis | ....................... | 294/64.1 |
| 3,702,698 A | * | 11/1972 | Schwhebel | ................. | 294/64.1 |
| 4,515,507 A | * | 5/1985 | Asai et al. | ................. | 294/64.1 |
| 4,793,657 A | * | 12/1988 | Mense | ......................... | 294/65 |
| 4,828,304 A | * | 5/1989 | No et al. | .................... | 294/64.1 |
| 5,544,411 A | * | 8/1996 | Kano et al. | .................... | 29/743 |
| 5,575,376 A | * | 11/1996 | Colamussi | ................... | 294/65 |
| 5,953,812 A | * | 9/1999 | Ferrante | .................... | 294/64.1 |

FOREIGN PATENT DOCUMENTS

| | | | | | |
|---|---|---|---|---|---|
| DE | 2207413 | * | 2/1989 | | 294/65 |
| DE | 0271503 | * | 9/1989 | | 294/64.1 |
| DE | 297381 | * | 1/1992 | | 901/40 |
| JP | 0031455 | * | 3/1977 | | 294/64.1 |
| SU | 1373667 | * | 2/1988 | | 294/64.1 |
| SU | 1634620 | * | 3/1991 | | 294/64.1 |

OTHER PUBLICATIONS

W.H. McDaniel, "Vacuum Pickup Device", Apr. 1971, Western Electric, Abstract.*
U.S. patent application Ser. No. 09/471,635, Bolotin et al., filed Dec. 24, 1999.

* cited by examiner

Primary Examiner—Christopher P. Ellis
Assistant Examiner—Paul T. Chin
(74) Attorney, Agent, or Firm—Mikio Ishimaru

(57) ABSTRACT

A pick and place system is provided with an actuator is responsive to the connection to an air power source to move to a pick-up position. The actuator moves a fork-type link which in turn moves a probe to compliantly move to pick up a micro device upon connection to the air power source. A replaceable precisor precisely aligns the micro device relative to the probe and a floating seal disposed around the probe and resting on the replaceable precisor seals the probe to the replaceable precisor. A system control, connectable to the electrical power source, is connected to the pneumatic and supply valves for selectively, electrically actuating the pneumatic and supply valves.

22 Claims, 3 Drawing Sheets

FLOATING SEAL PICK AND PLACE SYSTEM AND UNIT THEREFOR

CROSS-REFERENCE TO RELATED APPLICATION(S)

This application claims the benefit of U.S. Provisional patent application Ser. No. 60/275,552 filed Mar. 13, 2001.

The present application contains subject matter related to a copending U.S. patent application by Lev M. Bolotin 1015-006 entitled "PICK AND PLACE SYSTEM AND UNIT THEREFOR" now U.S. Pat. No. 6,364,387. The related application is assigned to Data I/O Corporation, is identified by Ser. No. 09/471,635, and is hereby incorporated by reference.

TECHNICAL FIELD

The present invention relates generally to manufacturing systems for integrated circuits and more particularly to pick and place systems for such manufacturing systems.

BACKGROUND ART

In the past, certain operations of electronic circuit board assembly were performed away from the main production assembly lines. While various feeder machines and robotic handling systems would populate electronic circuit boards with integrated circuits, the operations related to processing integrated circuits, such as programming, testing, calibration, and measurement were performed in separate areas on separate equipment rather than being integrated into the main production assembly lines.

For example, in the programming of programmable devices such as electrically erasable programmable read-only memories (EEPROMs) and Flash EEPROMs, separate programming equipment was used which was often located in a separate area from the circuit board assembly lines. There were a number of reasons why programming was done off-line.

First, the programming equipment was relatively large and bulky. This was because of the need to accurately insert and remove programmable devices at high speeds into and out of programming sockets in the programmer. Since insertion and removal required relatively long traverses at high speed and very precise positioning, very rigid robotic handling equipment was required. This rigidity requirement meant that the various components had to be relatively massive with strong structural support members to maintain structural integrity and precision positioning of the pick and place system moving at high speeds. Due to the size of the programming equipment and the limited space for the even larger assembly equipment, they were located in different areas.

Second, a single high-speed production assembly system could use up programmed devices faster than they could be programmed on a single programming mechanism. This required a number of programming systems which generally operated for longer periods of time in order to have a reserve of programmed devices for the production assembly systems. This meant that the operating times and the input requirements were different between the two systems.

Third, no one had been able to build a single system which could be easily integrated with both the mechanical and electronic portions of the production assembly systems. These systems are complex and generally require a great deal of costly engineering time to make changes to incorporate additional equipment.

A major problem associated with programming the programmable devices in a separate area and then bringing the programmed devices into the production assembly area to be inserted into the electronic circuit boards was that it was difficult to have two separate processes running in different areas and to coordinate between the two separate systems. Often, the production assembly line would run out of programmable devices and the entire production assembly line would have to be shut down. At other times, the programming equipment would be used to program a sufficient inventory of programmed devices to assure that the production assembly line would not be shut down; however, this increased inventory costs. Further problems were created when the programming had to be changed and there was a large inventory of programmed integrated circuits on hand. In this situation, the inventory of programmable devices would have to be reprogrammed with an accompanying waste of time and money.

While it was apparent that a better system would be desirable, there appeared to be no way of truly improving the situation. There were a number of apparently insurmountable problems that stood in the way of improvement.

First, the operating speeds of current production assembly lines so greatly exceeded the programming speed capability of conventional programmers that the programmer would have to have a much greater through-put than thought to be possible with conventional systems.

Second, not only must the programmer be faster than existing programmers, it must also have to be much smaller. The ideal system would integrate into a production assembly line, but would do so without disturbing an existing production assembly line or requiring the lengthening of a new production assembly line over that of the length without the ideal system. Further, most of these production assembly lines were already filled with, or designed to be filled with, various types of feeding and handling modules which provide limited room for any additional equipment.

Third, any programmer integrated with the production assembly line would apparently also have to interface with the control software and electronics of the production system software for communication and scheduling purposes. This would be a problem because production assembly line system software was not only complex, but also confidential and/or proprietary to the manufacturers of those systems. This meant that the integration must be done with the cooperation of the manufacturers, who were reluctant to spend engineering effort on anything but improving their own systems, or must be done with a lot of engineering effort expended on understanding the manufacturers' software before working on the programmer's control software.

Fourth, the mechanical interface between a programmer and the production equipment needed to be highly accurate for placing programmed devices relative to the pick-and-place handling equipment of the production assembly system.

Fifth, there are a large number of different manufacturers of production handling equipment as well as production manufacturing equipment. This means that the a large number of different production assembly line configurations would have to be studied and major compromises in design required for different manufacturers.

Sixth, the ideal system would allow for changing quickly between different micro devices having different configurations and sizes.

Seventh, the ideal system needed to be able to accommodate a number of different micro device feeding mechanisms including tape, tube, and tray feeders.

Finally, there was a need to be able to quickly reject micro devices which failed during the programming.

All the above problems seemed to render an effective solution impossible. This was especially true when trying to invent a comprehensive system which would be portable, allow "plug and play" operation with only external electric and air power, provide automated programming and handling, and be able to present programmed programmable devices to an automated production assembly line.

DISCLOSURE OF THE INVENTION

The present invention provides a micro device pick and place system which is connected to air and electrical power sources. The system has a pick and place unit including an actuator, a pick and place probe, and a compliant fork-type link connecting the actuator and probe. A replaceable precisor precisely aligns the micro device relative to the probe and a floating seal disposed around the probe and resting on the replaceable precisor seals the probe to the replaceable precisor. A control system activates a plurality of electrically powered pneumatic valves to selectively connect the air power source to the actuator to cause the compliant fork-type link to move the probe to and from pick and place positions. One of the plurality of pneumatic valves selectively connects and disconnects an air-powered vacuum to the probe to respectively pickup and release micro devices. The pick and place system is an efficient system for quickly and flexibly picking up and placing sensitive micro devices.

The present invention further provides a pick and place unit including an actuator, a pick and place probe, and a compliant fork-type link connecting the actuator and probe. A replaceable precisor precisely aligns the micro device relative to the probe and a floating seal disposed around the probe and resting on the replaceable precisor seals the probe to the replaceable precisor. A control system activates a plurality of electrically powered pneumatic valves which are connectable to the pick and place unit to selectively connect the air power source to the actuator to cause the compliant fork-type link to move the probe to and from pick and place positions. One of the plurality of pneumatic valves selectively connects and disconnects an air-powered vacuum to the probe to respectively pickup and release micro devices. The pick and place unit is an efficient mechanism for quickly and flexibly picking up and placing sensitive micro devices.

The present invention further provides a fail-safe pick and place unit and system which holds a micro device in the event of a pick and place system failure.

The present invention further provides a pick and place unit and system which is capable of picking and placing a plurality of micro devices both simultaneously and sequentially.

The present invention further provides a pick and place unit and system which allows for changing quickly between different micro devices having different configurations and sizes. A replaceable precisor precisely aligns the micro device relative to the probe and a floating seal disposed around the probe and resting on the replaceable precisor seals the probe to the replaceable precisor.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
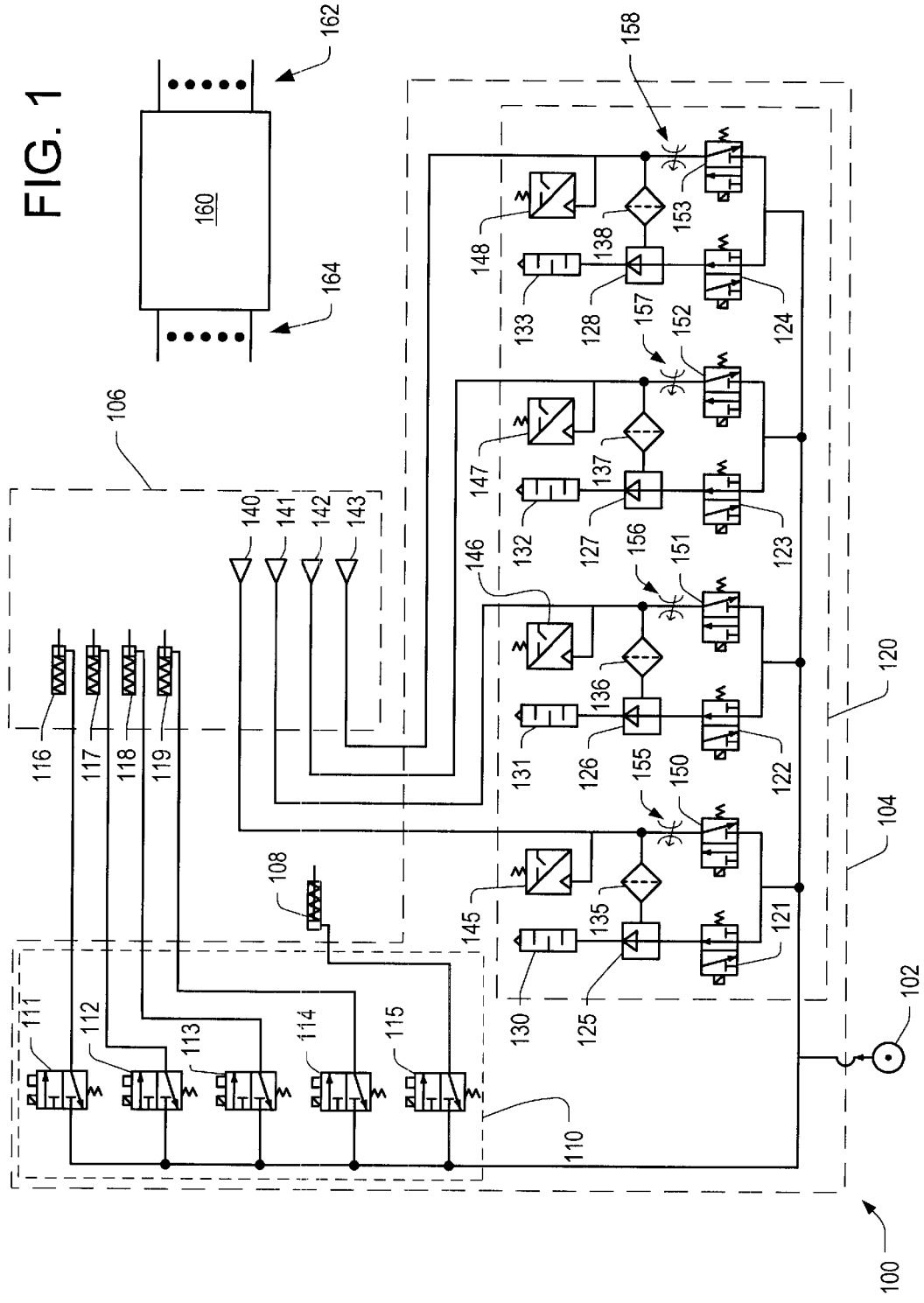
FIG. 1 is a shcematic of the pick and place system.

Organization:

Referring now to FIG. 1, therein is shown a pick and place system 100 which may be used to pick up and place various types of micro devices (not shown), which may be electronic, pneumatic, mechanical, etc. devices. The system 100 has an air source 102 which is connected to a pneumatic control system 104 which actuates a pick and place (PNP) unit 106 and a socket actuator 108.

The pneumatic control system 104 contains a pneumatic system 110 and a vacuum system 120.

The pneumatic system 110 consists of three-way, two-position solenoid-activated, spring-return pneumatic valves 111 through 115. The pneumatic valves 111 through 115 are normally closed and are respectively connected to pneumatically activated, spring-extend PNP actuators 116 through 119 and to the pneumatically activated, spring-return socket actuator 108.

The vacuum system 120 contains a plurality of three-way, two-position, solenoid-activated, spring-return supply valves 121 through 124 connected to the air source 102. The supply valves 121 through 124 are normally open and are respectively connected to venturi air ejectors 125 through 128, which are further connected to respective exhaust silencers 130 through 133.

The venturi air ejectors 125 through 128 use the venturi effect to create a vacuum through respective suction filters 135 through 138 at respective flexible rubber vacuum cups 140 through 143 in the PNP unit 106.

The vacuums at the vacuum cups 140 through 143 are monitored by respective air-activated, spring-return vacuum switches 145 through 148. The vacuum switches 145 through 148 provide output signals when a vacuum fails.

The vacuums at vacuum cups 140 through 143 are respectively broken by connecting the respective vacuum cups 140 through 143 to the air source 102 by three-way, two-position, solenoid activated, spring-return breaking valves 150 through 153 and their respective needle valves 155 through 158. The breaking valves 150 through 153 are normally closed.

The system 100 is electrically controlled by a control system 160 which has various control and power inputs 162, which include inputs from the vacuum switches 145 through 148, and various outputs 164, which include outputs to the pneumatic valves 111 through 115, the supply valves 121 through 124, and the breaking valves 150 through 153. The control system 160 may be a microprocessor or microcontroller.

Figure 2:
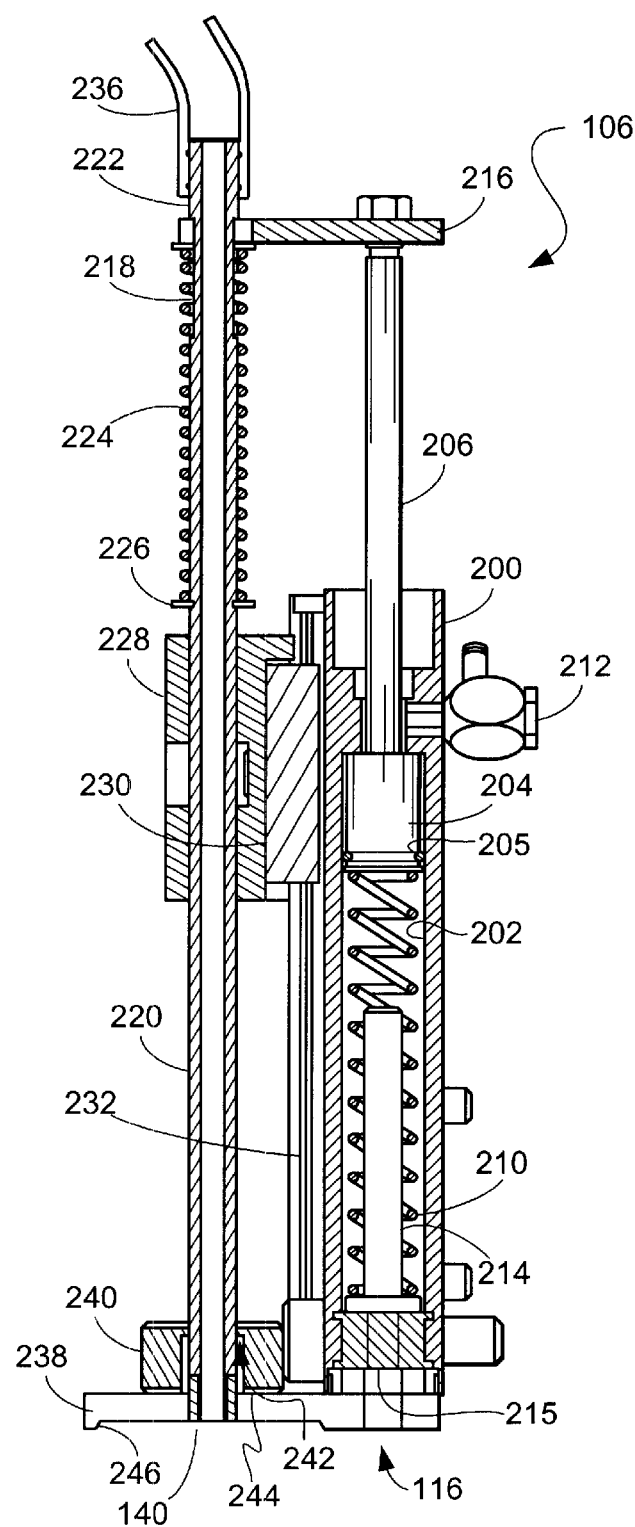
FIG. 2 is a cross section of the pick and place unit.
Figure 3:
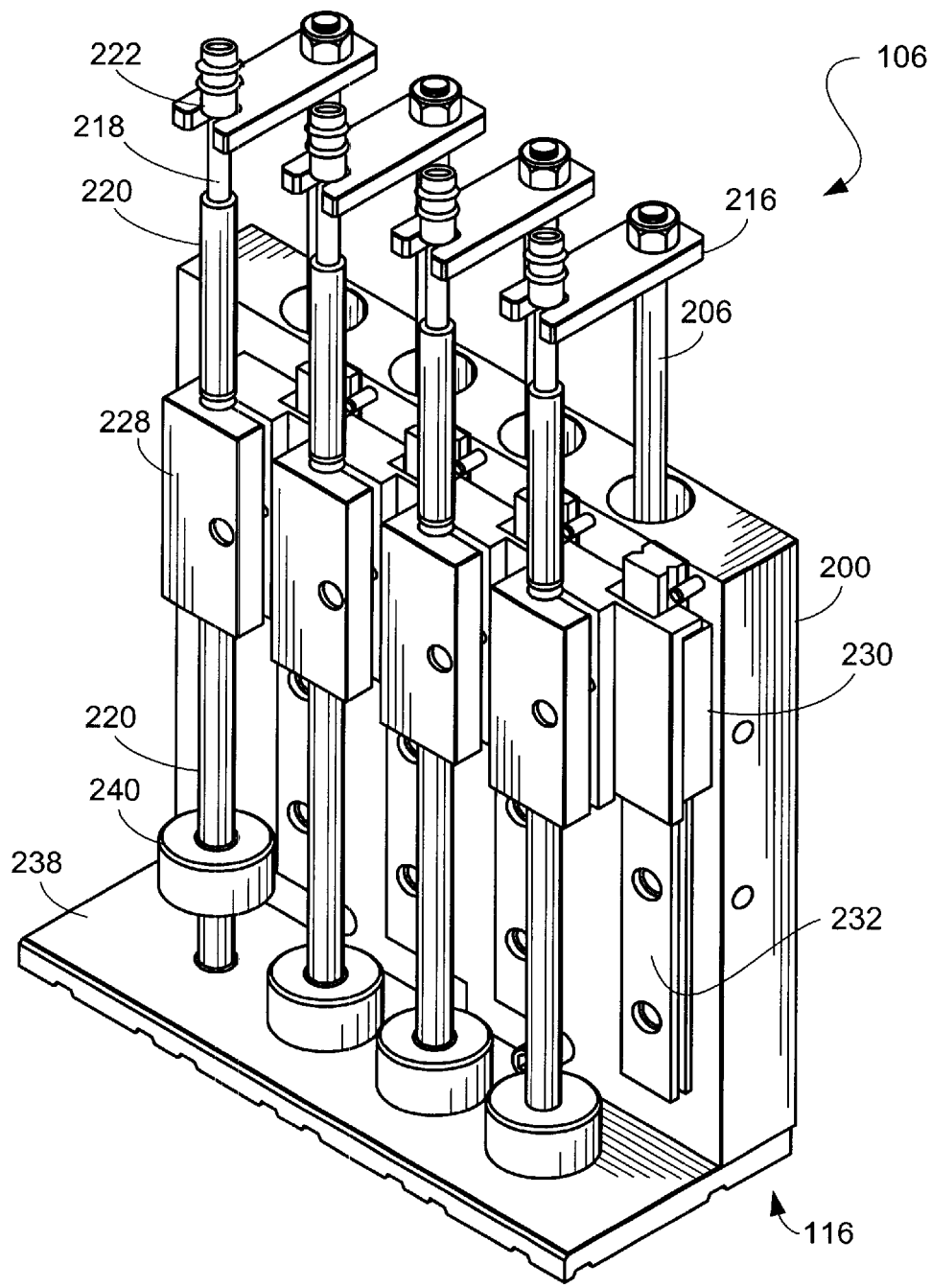
FIG. 3 is an isometric view of the pick and place unit according to the present invention.

Referring now to FIGS. 2 and 3, therein is shown the PNP unit 106 with the PNP actuator 116, and a vacuum cup 140. The term "horizontal" as used in herein is defined as a plane perpendicular to the axis of a pneumatic cylinder in the PNP actuator 116 regardless of the orientation of the PNP unit 106. The term "vertical" refers to a direction perpendicular to the horizontal as just defined. Terms, such as "on", "above", "below", "side" (as in "sidewall"), "higher", "lower", "over", and "under", are defined with respect to the horizontal plane. It will be understood that the horizontal is subject to change depending upon the orientation of micro devices to be picked and placed.

The PNP actuator 116 consists of a cylinder block 200 having a cylinder chamber 202 provided therein. The cylinder chamber 202 contains a piston 204 having an O-ring 205. The piston 204 is connected to a cylinder rod 206 extending through cylinder packing 208. The piston is held in the normally "up" position by a spring 210 and is activated by air pressure at a port 212 to stop on a stop pin 214 secured to a block 215 in the bottom of the cylinder block 200. The cylinder rod 206 is secured to a fork-type link 216.

The fork-type link 216 slides on a reduced-diameter slide portion 218 of a probe 220. The probe 220 is restrained between the full-diameter portion 222 of the probe 220 and a compliance spring 224 which is seated on a snap ring 226 secured to the probe 220. The probe 220 is held by a clamp 228 to a linear bearing slide carriage 230 which moves vertically on linear guide 232. The fork-type link 216 allows the probe 220 to move up and down in parallel with the cylinder rod 206. It pushes against the compliance spring 224 which acts against the snap ring 226 to push the probe 220 "down". When the probe 220 rests on the surface of the micro device, the compliance spring 224 allows the fork-type link 216 to continue to move while the probe 220 stops. This avoids damage to the the micro device. The compliance spring 224 always pushes the probe 220 against the fork-type link 216. The compliance spring 224 is a very light spring and creates just enough pressure for the probe 220 to be in the down position, but not enough to damage a highly sensitive micro device. Thus, the probe 220 moves "compliantly" relative to the fork-type link 216.

The probe 220 is hollow is connected to a vacuum line 236 at the top end. At the bottom end of the probe 220 is the vacuum cup 140. A replaceable precisor 238 surrounds the vacuum cup 140 and is magnetically attached to the cylinder block 200. A floating seal 240 surrounds the vacuum cup 140 and rests on the replaceable precisor 238 to prevent air leakage from the top of the replaceable precisor 238 to the vacuum cup 140.

The floating seal 240 has a lip 242 to seal against the probe 220 and a face 244 to seal against the replaceable precisor 238. The replaceable precisor 238 is a plate having internal taper sidewalls 246 which a micro device will abut and be aligned and positioned by relative to the probe 220. The replaceable precisor 238 may be replaced by different size pecisors which are sized to match the different sized micro devices.

Operation:

In operation, when no air is supplied from the air source 102, in FIG. 1, the pneumatic valves in 111 through 115 are normally closed, the supply valves 121 through 124 are normally open, and the breaking valves 150 through 153 are normally closed. Also, the vacuum switches 145 through 148 are normally closed.

When air is supplied by the air source 102, air is provided to the air ejectors 125 through 128 causing vacuums to be created by venturi effect and applied at the vacuum cups 140 through 143. The normally open mode of the supply valves 121 through 124 provides a fail-safe mode to hold any micro devices in the PNP unit 106 if there is an electrical power failure but not an air power failure.

To pick a micro device, the control system 160 sends signals out through the output lines 164 to selectively actuate the solenoids on the pneumatic valves 111 through 114. Taking the actuation of the penumatic valve 111 as an example, the application of air pressure causes the PNP actuator 116 to retract its cylinder rod 206 against the spring 210. The retraction of the cylinder rod 206 forces the fork-type link 216 down to first cause the probe 220 to extend downward. After the initial extension downward, further movement of the fork-type link 216 compresses the compliance spring 224 and cause the probe 220 to extend downward until it contacts a micro device. The compliance spring 224 allows the PNP actuator 116 to continue its movement while the probe 220 is stopped without damaging the micro device. Thus, the probe 220 is capable of "compliant" movement.

When the probe 220 extends down, it will contact the micro device with the flexible vacuum cup 140 and the vacuum will grip or hold the micro device in place on the probe 220. To complete the pick-up operation, the solenoid of the pneumatic valve 111 is deactivated, and the spring return of the pneumatic valve 111 releases the air in the cylinder chamber 202 to allow the the spring 210 to move the piston 204 to its "up" position. As the piston 204 moves "up", the cylinder rod 206 moves "up" and, through the fork-type link 216 and the stop nut 222, the probe 220 moves "up". As the probe 220 moves to its "up" position, the replaceable precisor 238 precisely aligns the micro device by virtue of tapered sidewalls 246 provided therein. The micro devices are generally box-shaped and the replaceable precisor 238 rotates the box-shaped device in line with the length of the tapered sidewalls 246. As previously noted, the supply valve 121 is normally open, so in the event of an electrical power failure, the micro device will be retained by the vacuum cup 140.

As would be understood by those skilled in the art, the pnuematic valves 111 through 114 would be sequentially activated to cause the PNP actuators 116 through 119, respectively, to sequentially pick up micro devices. It should be noted that the control system 160 could also be activated to have the PNP actuators simultaneously pick up micro devices if they were properly spaced for the four PNP actuators 116 through 119.

To put down or place the micro devices, the pneumatic valves 111 through 114 would be activated to cause the PNP actuators 116 through 119 to extend downward. For example, when actuating the pneumatic valve 111, air would be provided to the port 212 to cause the piston 204 to retract the cylinder rod 206. This would force the fork-type link 216 down against the compliance spring 224 to cause the probe 220 to move down.

When the probe 220 is down, the solenoid of the supply valve 121 will be activated to close off and release any air pressure in the air ejector 125 and breaking valve 150 will be momentarily activated to apply an air pulse to the vacuum cup 140 to cause a "puff" of air to cause positive release of the micro device. The solenoid of the pneumatic valve 111 would then be deactivated to allow release of air through the port 212 allowing the probe 220 to return to its "up" position.

The present invention also includes the socket actuator 108 which is used to activate a securing mechanism (not shown) to secure the micro device in the socket and provide proper electrical contact after it has been released by the probe 220. Thus, the pneumatic valve 115 is activated to actuate the socket actuator 108.

As would be evident to those skilled in the art, the suction filters 135 through 138 keep the system clear of detrimental particles, and the exhaust silencers 130 through 133 keep the system from being too noisy.

Also, as would be evident to those skilled in the art, while individual valves are shown, different manifolds and valve combinations are possible to achieve the objectives shown for the present invention. Further, different sequences for application and removal of air are also possible.

While the invention has been described in conjunction with a specific best mode, it is to be understood that many alternatives, modifications, and variations will be apparent

The invention claimed is:

1. A pick and place unit for picking up a micro device and useable with a system control connectable to a power source, comprising:
   an actuator having a first normal position and responsive to a connection to the power source to move to a pick-up position;
   a fork-type link connected to the actuator;
   a probe having a first normal position and connected to the fork-type link to compliantly move to a pick-up position in response to the actuator move to the pick-up position, the probe responsive to a connection to the power source to releaseably hold the micro device;
   a replaceable precisor for precisely aligning the micro device relative to the probe; and
   a floating seal disposed around the probe, the floating seal resting on the replaceable precisor and sealing the probe to the replaceable precisor.

2. The pick and place unit as claimed in claim 1 wherein the probe is hollow and is connectable at one end to a fluid power source and is capable of releaseably holding the micro device at the other end.

3. The pick and place unit as claimed in claim 1 wherein a spring is disposed in the connection between the fork-type link and the probe to allow the probe to move compliantly relative to the fork-type link.

4. The pick and place unit as claimed in claim 1 including a body containing the actuator and the probe.

5. A pick and place system connectable to a power source, comprising:
   a pick and place unit including:
      an actuator having a first normal position and responsive to the connection to the power source to move to a pick-up position;
      a fork-type link connected to the actuator;
      a probe having a first normal position and connected to the fork-type link to compliantly move to a pick-up position in response to the actuator move to the pick-up position, the probe responsive to a connection to the power source to releaseably hold the micro device;
      a replaceable precisor for precisely aligning the micro device relative to the probe; and
      a floating seal disposed around the probe, the floating seal resting on the replaceable precisor and sealing the probe to the replaceable precisor; and
   a first valve connected to the actuator capable of actuation to connect the power source to the actuator;
   a second valve connected to the probe capable of actuation to remove the power source from the probe; and
   a system control connectable to the power source and to the first and second valves for selectively actuating the first and second valves.

6. The pick and place system as claimed in claim 5 including a third valve connected to the system control and the power source to cause the probe to positively release the micro device.

7. The pick and place system as claimed in claim 5 including:
   a third valve connected to the system control and the power source to cause the probe to positively release the micro device; and
   a needle valve disposed between the breaking valve and the probe to control the release.

8. The pick and place system as claimed in claim 5 including:
   an ejector disposed between the second valve and the probe to provide a vacuum to the probe for holding the micro device.

9. The pick and place system as claimed in claim 5 including:
   an ejector disposed between the second valve and the probe to provide a vacuum to the probe for holding the micro device; and
   a filter disposed between the ejector and the probe.

10. The pick and place system as claimed in claim 5 including:
    an ejector disposed between the second valve and the probe to provide a vacuum to the probe for holding the micro device; and
    a vacuum switch operatively connected to the ejector to provide an indication of the vacuum created therein.

11. A pick and place unit for picking up a micro device and useable with a system control connectable to an air and an electrical power source, comprising:
    an actuator having a first normal position and responsive to a connection to the air power source to move to a pick-up position;
    a fork-type link connected to the actuator;
    a probe having a first normal position and connected to the fork-type link to compliantly move to a pick-up position in response to the actuator move to the pick-up position, the probe responsive to a connection to the air power source to releaseably hold the micro device;
    a replaceable precisor for precisely aligning the micro device relative to the probe; and
    a floating seal disposed around the probe, the floating seal resting on the replaceable precisor and sealing the probe to the replaceable precisor.

12. The pick and place unit as claimed in claim 11 including a replaceable precisor disposed on the probe for precisely aligning the micro device relative to the probe.

13. The pick and place unit as claimed in claim 11 wherein the probe is hollow and is connectable at one end to the air power source and has a flexible cup at the other end to releaseably hold the micro device.

14. The pick and place unit as claimed in claim 11 wherein:
    a compliance spring is disposed in the connection between the fork-type link and the probe to allow the probe to move compliantly relative to the fork-type link; and
    a spring is provided in the actuator to move the actuator to the first normal position.

15. The pick and place unit as claimed in claim 11 including a body containing the actuator, the body allowing the actuator and the probe to move in parallel.

16. A pick and place system connectable to an air and an electrical power source, comprising:
    a pick and place unit including:
       an actuator having a first normal position and responsive to the connection to the air power source to move to a pick-up position;
       a fork-type link connected to the actuator;

a probe having a first normal position and connected to the fork-type link to compliantly move to a pick-up position in response to the actuator move to the pick-up position, the probe responsive to a connection to the air power source to releaseably hold the micro device;

a replaceable precisor for precisely aligning the micro device relative to the probe; and a floating seal disposed around the probe, the floating seal resting on the replaceable precisor and sealing the probe to the replaceable precisor; and a pneumatic valve connected to the actuator capable of electrical actuation to connect the air power source to the actuator;

a supply valve connected to the probe capable of electrical actuation to remove the power source from the probe; and a system control connectable to the electrical power source and to the pneumatic and supply valves for selectively, electrically actuating the pneumatic and supply valves.

17. The pick and place system as claimed in claim 16 including a breaking valve electrically connected to the system control and connected to the air power source, the breaking valve electrically responsive to the system control to connect the air power source to the probe to cause the probe to positively release the micro device.

18. The pick and place system as claimed in claim 16 including:
   a breaking valve electrically connected to the system control and connected to the air power source, the breaking valve electrically responsive to the system control to connect the air power source to the probe to cause the probe to positively release the micro device; and
   a needle valve disposed between the breaking valve and the probe to control the release.

19. The pick and place system as claimed in claim 16 including:
   a venturi air ejector disposed between the supply valve and the probe to provide a vacuum to the probe for holding the micro device and removing the vacuum to the probe for releasing the micro device.

20. The pick and place system as claimed in claim 16 including:
   a venturi air ejector disposed between the supply valve and the probe to provide a vacuum to the probe for holding the micro device and removing the vacuum to the probe for releasing the micro device; and
   a filter disposed between the venturi air ejector and the probe for filtering air from the probe to the air ejector.

21. The pick and place system as claimed in claim 16 including:
   a venturi air ejector disposed between the supply valve and the probe to provide a vacuum to the probe for holding the micro device and removing the vacuum to the probe for releasing the micro device; and
   a vacuum switch operatively connected to the venturi air ejector to provide an indication upon the failure of the vacuum.

22. The pick and place system as claimed in claim 16 including:
   a second pick and place unit including:
      a second actuator having a first normal position and responsive to the connection to the air power source to move to a pick-up position;
      a second fork-type link connected to the second actuator;
      a second probe having a first normal position and connected to the second fork-type link to compliantly move to a pick-up position in response to the second actuator move to the pick-up position, the second probe responsive to a connection to the air power source to releaseably hold the micro device;
      a second replaceable precisor for precisely aligning the micro device relative to the second probe; and
      a second floating seal disposed around the second probe, the second floating seal resting on the replaceable precisor for sealing the second probe to the second replaceable precisor; and
   a second pneumatic valve connected to the second actuator capable of electrical actuation to connect the air power source to the second actuator;
   a second supply valve connected to the second probe capable of electrical actuation to remove the power source from the second probe; and
   the system control connected to the second pneumatic and supply valves for selectively, electically activating the second pneumatic and supply valves, the system control capable of simultaneously, sequentially, or selectively, electrically activating the valves.

* * * * *